United States Patent
Bhat et al.

(10) Patent No.: US 7,994,514 B2
(45) Date of Patent: Aug. 9, 2011

(54) SEMICONDUCTOR LIGHT EMITTING DEVICE WITH INTEGRATED ELECTRONIC COMPONENTS

(75) Inventors: Jérôme C. Bhat, San Francisco, CA (US); Steven T. Boles, Santa Clara, CA (US)

(73) Assignees: Koninklijke Philips Electronics N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 1333 days.

(21) Appl. No.: 11/408,841

(22) Filed: Apr. 21, 2006

(65) Prior Publication Data

US 2007/0246716 A1 Oct. 25, 2007

(51) Int. Cl.
*H01L 33/00* (2010.01)

(52) U.S. Cl. ............. 257/79; 257/81; 257/93; 257/99; 257/E27.12; 257/E33.055; 257/E33.062; 257/E33.066

(58) Field of Classification Search ............ 257/81, 257/E27.12, 79, 93, 99, E33.055, E33.062, 257/E33.066
See application file for complete search history.

(56) References Cited

U.S. PATENT DOCUMENTS

| | | | |
|---|---|---|---|
| 4,013,918 A | | 3/1977 | Lebailly |
| 5,977,565 A | * | 11/1999 | Ishikawa et al. ........... 257/81 |
| 6,054,716 A | * | 4/2000 | Sonobe et al. ............ 250/552 |
| 6,229,181 B1 | * | 5/2001 | Kravtchenko et al. ....... 257/355 |
| 6,274,924 B1 | * | 8/2001 | Carey et al. ............... 257/676 |
| 6,333,522 B1 | | 12/2001 | Inoue et al. |
| 6,355,945 B1 | | 3/2002 | Kadota et al. |
| 6,410,943 B1 | * | 6/2002 | Enquist ..................... 257/97 |
| 6,480,110 B2 | * | 11/2002 | Lee et al. ................. 340/572.5 |
| 6,521,914 B2 | | 2/2003 | Krames et al. |
| 6,547,249 B2 | | 4/2003 | Collins, III et al. |
| 6,828,596 B2 | * | 12/2004 | Steigerwald et al. ......... 257/99 |
| 6,838,705 B1 | * | 1/2005 | Tanizawa .................. 257/101 |
| 2006/0169993 A1 | * | 8/2006 | Fan et al. .................. 257/88 |

FOREIGN PATENT DOCUMENTS

| | | |
|---|---|---|
| DE | 2431129 A1 | 1/1975 |
| DE | 19931149 A1 | 1/2000 |
| DE | 102005043649 A1 | 4/2006 |

OTHER PUBLICATIONS

Merriam-Webster OnLine definition of "sandwiched."*
Patricia A. Beck et al., "High Current Density in μc-Si PECVD Diodes for Low Temperature Applications," Hewlett-Packard publication, Apr. 6, 2004, 7 pages.
International Searching Authority: PCT/IB2007/051372, International Filing Date: Apr. 17, 2007.

* cited by examiner

*Primary Examiner* — Hrayr A Sayadian

(57) ABSTRACT

One or more circuit elements such as silicon diodes, resistors, capacitors, and inductors are disposed between the semiconductor structure of a semiconductor light emitting device and the connection layers used to connect the device to an external structure. In some embodiments, the n-contacts to the semiconductor structure are distributed across multiple vias, which are isolated from the p-contacts by one or more dielectric layers. The circuit elements are formed in the contacts-dielectric layers-connection layers stack.

10 Claims, 6 Drawing Sheets

SEMICONDUCTOR LIGHT EMITTING DEVICE WITH INTEGRATED ELECTRONIC COMPONENTS

BACKGROUND

1. Field of Invention

The present invention relates to semiconductor light emitting devices including integrated electronic components.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, a light emitting or active region formed over the n-type layer or layers, and one or more p-type layers doped with, for example, Mg, formed over the active region. III-nitride devices formed on conductive substrates may have the p- and n-contacts formed on opposite sides of the device. Often, III-nitride devices are fabricated on insulating substrates, such as sapphire, with both contacts on the same side of the device. Such devices are mounted so light is extracted either through the contacts (known as an epitaxy-up device) or through a surface of the device opposite the contacts (known as a flip chip device).

Light emitting devices are sensitive to electrostatic discharge. FIG. 1 illustrates a prior art III-nitride device mounted on a silicon diode element that includes an electrostatic discharge protection circuit, described in more detail in FIG. 13 and column 19 lines 29-64 of U.S. Pat. No. 6,333,522. GaN LED element 1 is mounted on leadframes 13a and 13b with a Si diode element 2 having p-side and n-side electrodes interposed therebetween, not directly on the leadframes. The Si diode element 2 with the main surface thereof facing upward and with the back face thereof facing downward is disposed on a die pad forming the tip of the leadframe 13a having a reflecting mirror. The Si diode element 2 is die-bonded to the die pad with an Ag paste 14, while having an n-side electrode 9 on the back face thereof in contact with the die pad of the leadframe 13a. A p-side electrode 7, an n-side electrode 8, and a bonding pad portion 10 of the p-side electrode are provided on the top face of the Si diode element 2. The GaN LED element 1 having the top face of the sapphire substrate facing downward and the p-side and n-side electrodes 5 and 6 facing downward is positioned above the Si diode element 2. The p-side and n-side electrodes 5 and 6 of the GaN LED element 1 are electrically connected to the n-side and p-side electrodes 8 and 7 of the Si diode element 2 via Au microbump 12 and 11, respectively. The GaN LED element 1 is fixed to the Si diode element 2 with a UV curable insulating resin 16. The mechanical connection between the GaN LED element 1 and the Si diode element 2 may be accomplished by welding the microbumps 11 and 12 instead of using the UV, curable insulating resin 16. The bonding pad portion 10 of the p-side electrode of the Si diode element 2 is connected by wire bonding to the lead frame 13b via an Au wire 17. A reflector 15 for upwardly reflecting light is attached to a side face of the die pad of the leadframe 13a, whereby the GaN LED element 1 is surrounded. The tip portions of the leadframes 13a and 13b are entirely molded with a transparent epoxy resin 18 with the GaN LED element 1 and the Si diode element 2 mounted thereon to constitute the LED lamp.

Other circuit elements besides electrostatic discharge protection circuitry may be included in the silicon diode illustrated in FIG. 1. One drawback to the device illustrated in FIG. 1 is the external silicon structure on which LED element 1 is mounted limits the flexibility of the design of the LED element and the package. Also, the external silicon structure may undesirably increase the source size of the light source provided by LED element 1, potentially complicating the design and increasing the cost of optics such as lenses used with the device shown in FIG. 1.

An alternative design of an electrostatic discharge protection structure is shown in FIG. 17 and column 23 lines 1942 of U.S. Pat. No. 6,333,522. FIG. 17 is reproduced here as FIG. 2, which illustrates a GaN LED element 1 with a double heterostructure comprising a GaN buffer layer 31, an n-type GaN layer 32, an InGaN active layer 33, a p-type AlGaN layer 34, and a p-type GaN layer 35 which are stacked sequentially in layers on the top face of a sapphire substrate 30. The top face of the n-type GaN layer 32 has a stepped configuration consisting of an upper-level portion occupying the major part of the top face and a lower-level portion occupying the remaining minor part thereof. An n-side electrode 6 made of a Ti/Au multi-layer film and a Ni/Au multilayer film laminated thereon is formed in stacking relation on the top face of the lower-level portion of the n-type GaN layer 32. The aforesaid InGaN active layer 33, p-type AlGaN layer 34, and p-type GaN layer 35 are stacked sequentially in layers on the top face of the upper-level portion of the n-type GaN layer 32. A p-side electrode 5 made of Ni and Au is disposed directly on the top face of the p-type GaN layer 35 with no intervention of a transparent electrode for current diffusion. See U.S. Pat. No. 6,333,522, column 12 lines 22-40.

An interlayer insulating film 51 made of a silicon oxide film is formed on the GaN LED element 1. In the silicon thin film, a p-type semiconductor region 52 and an n-type semiconductor region 53 are formed. The silicon thin film can be formed easily by utilizing TFT formation technology associated with a liquid-crystal device. The diode element 50 is provided with a p-side electrode 54 filling in a through hole formed in the interlayer insulating film 51 to be connected to the n-side electrode 6 of the GaN LED element 1, while being connected to the p-type semiconductor region 52 thereof. The diode element 50 is also provided with an n-side electrode 55 filling in a though hole formed in the interlayer insulating film 51 to be connected to the p-side electrode 5 of the GaN LED element 1, while being connected to the n-type semiconductor region 53 thereof. The p-side and n-side electrodes 54 and 55 of the diode element 50 are connected to leadframes by wire bonding. In this case, light generated by the GaN LED element 1 is reflected by the leadframes and emitted upward. However, since the diode element 50 can be formed in a narrow limited region, desired light-emitting efficiency can easily be achieved. See U.S. Pat. No. 6,333,522, column 23 lines 1942.

The small size of the electrostatic discharge protection diode in the device of FIG. 2 limits its ability to protect the LED element from electrostatic discharge.

SUMMARY

In accordance with embodiments of the invention, one or more circuit elements such as silicon diodes, resistors, capacitors, and inductors are disposed between the semiconductor structure of a semiconductor light emitting device and the connection layers used to connect the device to an external structure. In some embodiments, the n-contacts to the semiconductor structure are distributed across multiple vias, which are isolated from the p-contacts by one or more dielectric layers. The circuit elements are formed in the contacts-dielectric layers-connection layers stack.

DETAILED DESCRIPTION

Figure 3:
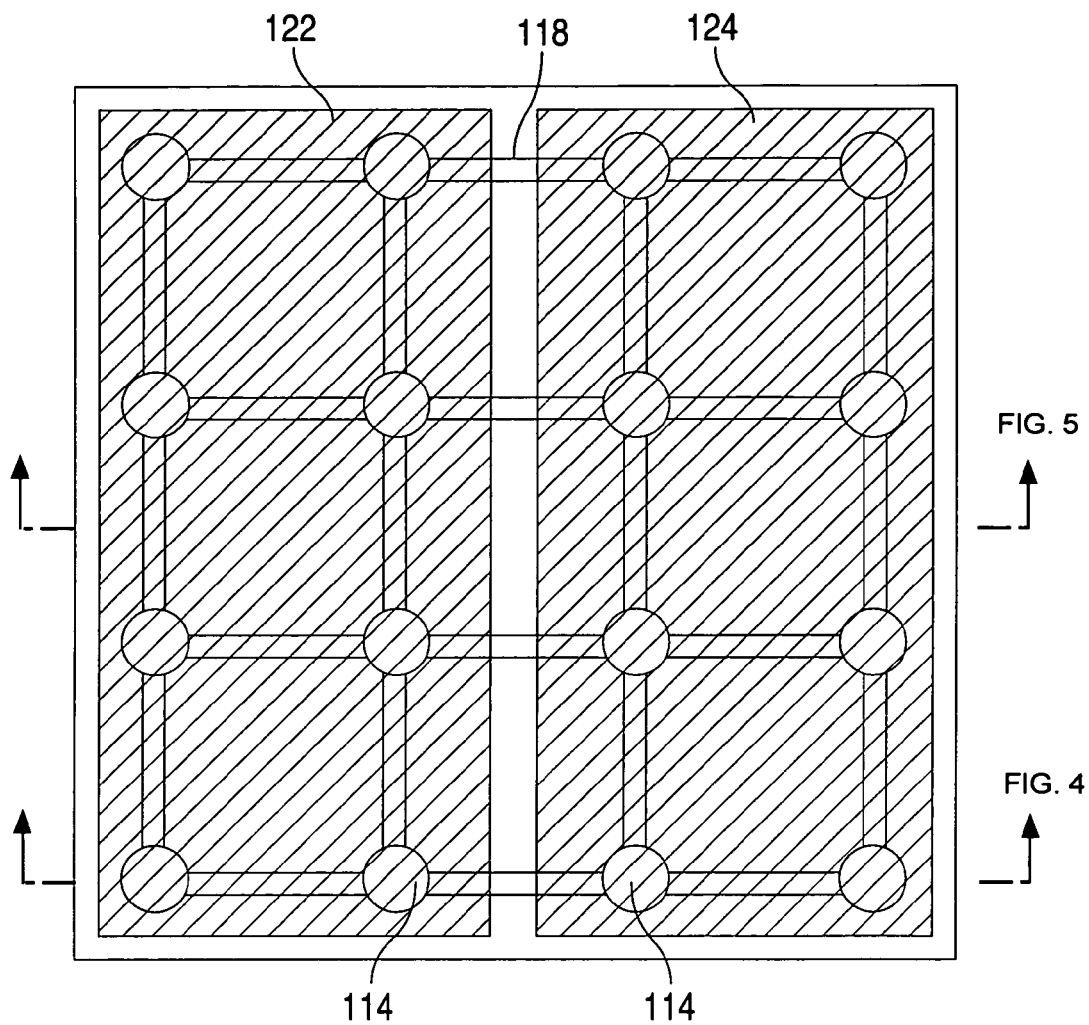
FIG. 3 is a plan view of a semiconductor light emitting device including an n-contact distributed over a plurality of vias.
Figure 4:
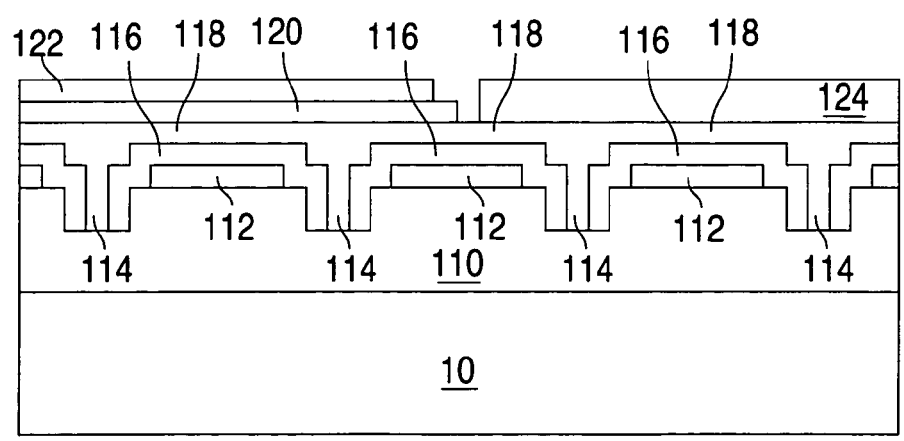
FIGS. 4 and 5 are cross sectional views of the device of FIG. 3 along the axes shown.
Figure 5:
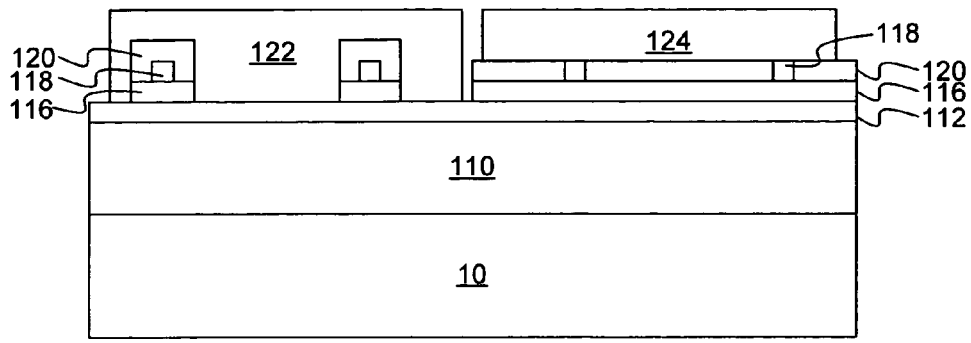

A III-nitride semiconductor light emitting device with the n-contact distributed over a plurality of vias, instead of formed as a single continuous sheet, is described in U.S. Pat. No. 6,828,596, titled "Contacting scheme for large and small area semiconductor light emitting flip chip devices," and incorporated herein by reference. FIG. 3 is a plan view and FIGS. 4 and 5 are cross sectional views of such a device. As illustrated in FIGS. 4 and 5, an epitaxial structure 110, including a light emitting region disposed between an n-type region and a p-type region, is grown on a substrate 10. The n-contact metal layer 114 directly connected to the n-type region is distributed over a plurality of vias etched through the epitaxial structure to expose an n-type layer.

The n-contact metal 114 in a given via is electrically connected to the n-contact metal in other vias by horizontal and vertical interconnects 118. The width of interconnects 118, as shown in FIG. 3, may be, for example, on the order of 10 microns. The thickness of interconnects 118, as shown in FIGS. 4 and 5, may be, for example, on the order of several microns. Connection layers 122 and 124 make electrical connection between the light emitting device and a mount on which the light emitting device is mounted, while providing a thermal path for heat removal during operation. Connection layers 122 and 124 may be solder layers, or any other type of conductive connection between the submount and the device such as elemental metals, metal alloys, semiconductor-metal alloys, thermally and electrically conductive pastes or compounds (e.g. epoxies), eutectic joints between dissimilar metals between the light emitting device and the submount (e.g. Pd—In—Pd), gold stud-bumps, or solder bumps. Connection layer 122 connects to portions of the p-contact of the device, and connection layer 124 connects to some of the n-contact metals 114 deposited in the vias and the interconnects 118 electrically connecting the n-contact metals 114 in individual vias.

As is shown in FIG. 3, the n-contact metals 114 and interconnects 118 may form a grid over the device. Though only the n-contacts 114 within the vias directly contact the n-type layer, interconnects 118 are electrically connected to the vias and are thus electrically connected to the n-type layers. In contrast to a device with a single large n-contact, n-contact metals 114 within the vias and interconnects 118 are not confined to a particular area on the chip. Similarly, the grid formed by n-contact metals 114 within the vias and interconnects 118 encloses an array of nine p-contact sections, at least some of which are available as p-contacts to a mount. Like the n-contacts, the p-contact sections are not confined to a particular area on the chip. Thus, since p-contacts and n-contacts may be electrically accessed from many places on the chip, connection layers 122 and 124 are not limited by the shape and location of the p- and n-contacts.

FIG. 4 is a cross section of the device shown in FIG. 3, taken along the axis shown in FIG. 3. The n-contact metals 114 within the vias are isolated from the p-type layers and p-metal contacts 112 by dielectric layer 116. An n-metal layer may then be deposited over the entire chip and patterned to form n-contacts 114 in the vias and interconnects 118. A horizontal interconnect 118 is shown in FIG. 4. A second dielectric layer 120 is then deposited over the chip. The second dielectric layer 120 is patterned to create a first set of openings aligned with p-metal regions 112 on the left side of the device underlying connection layer 122, and a second set of openings aligned with the n-contact metal 114 within the vias and interconnects 118 on the right side of the device underlying connection 124. Since connection layer 122 is the p-contact to the mount, dielectric layer 120 isolates connection layer 122 from interconnect 118. Since connection layer 124 is the n-contact to the mount, dielectric layer 120 is removed from the interconnects and vias underlying connection layer 124 such that connection layer 124 can make electrical contact with the n-contact metals 114 within the vias and interconnect 118.

FIG. 5 is a cross section of the device shown in FIG. 3, taken along the axis shown in FIG. 3. Connection layer 122 makes contact to p-metal 112, thus in the area directly underlying connection layer 122, all of dielectric layer 120 is removed, except the portion covering interconnects 118. Connection layer 124 makes contact to the n-contacts and interconnects, thus in the area underlying connection layer 124 dielectric layer 120 is removed only from the top surface of interconnects 118. P-metal layer 112 is thus isolated from connection layer 124 by dielectric layer 120. Connection layers 122 and 124 need not be deposited as shown in FIG. 3. Other configurations are possible by properly patterning dielectric layer 120.

In accordance with embodiments of the invention, circuit elements such as capacitors, resistors, inductors, and diodes may be integrated into a semiconductor light emitting device between the semiconductor layers and the connection layers used to connect the device to a mount or other external device. Dielectric layers 116 and 120 shown in FIGS. 4 and 5, which isolate the contact metals from the connection layers, facilitate the formation of the circuit elements.

Figure 7:
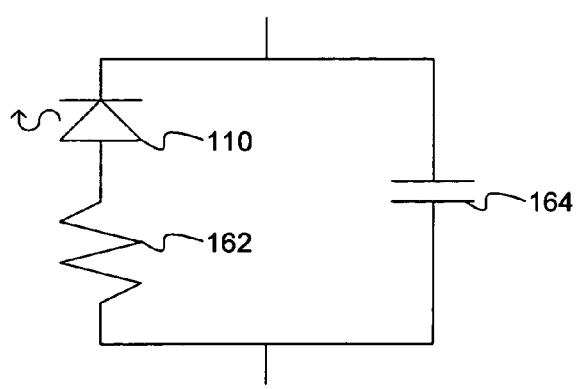
FIG. 7 is a circuit diagram of the device illustrated in FIG. 6.

FIG. 7 is a circuit diagram of an example of a device including integrated circuit elements, according to embodiments of the invention. A capacitor 164 and resistor 162 are formed between the semiconductor layers that form light emitting diode 110 and the connection layers used to connect the device to an external structure. Resistor 162 is connected in series and capacitor 164 is connected in parallel with light emitting diode 110.

Figure 6:
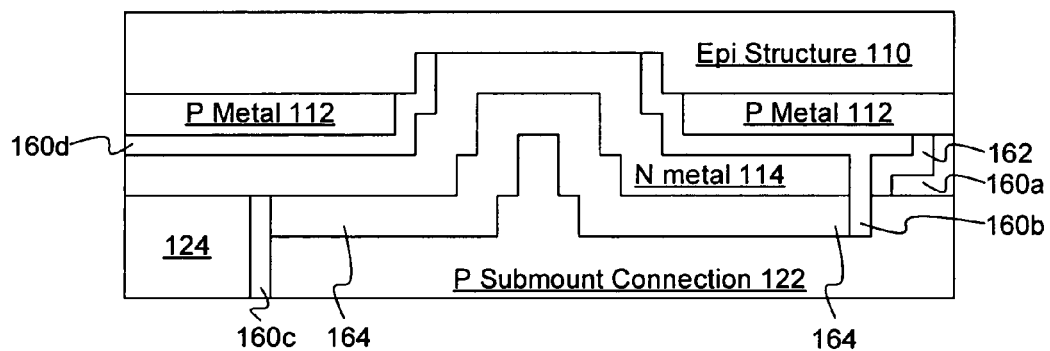
FIG. 6 is a cross sectional view of a part of a device including a capacitor and resistor disposed between the semiconductor layers and the connection layers used to connect the device to an external structure, according to embodiments of the invention.

FIG. 6 is a cross sectional view of a portion of a device according to the circuit diagram shown in FIG. 7. A mesa is formed in epitaxial structure 110, which includes one or more n-type layers, one or more light emitting layers, and one or more p-type layers. The mesa exposes an n-type layer on which n-contact 114 is formed. P-contacts 112 are formed on the remaining surface of epitaxial structure 110. P-contact 112 on the right side of the figure is connected to connection layer 122 through resistor 162, which is isolated from other metal layers in the device by dielectric layers 160*a* and 160*b*.

Figure 8:
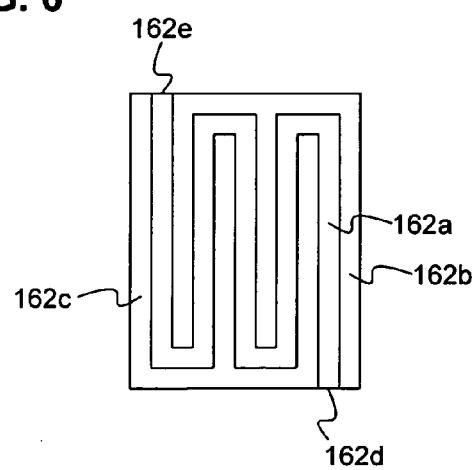
FIG. 8 is a plan view of the resistor illustrated in FIG. 6.

A plan view of resistor 162 is shown in FIG. 8. A thin metal layer 162*a* is formed between two dielectric segments 162*b* and 162*c*. The resistance of resistor 162 is controlled by adjusting the length of wire 162*a*. One end 162*d* of resistor 162 is connected to p-connection layer 122, and the other end 162*e* of resistor 162 is connected to p-contact 112.

Returning to FIG. 6, n-contact 114 is connected to n-connection layer 124 on the left side of the figure. A capacitor 164 is connected between p-connection layer 122 and n-contact 114. Dielectric layers 160*b* and 160*c* electrically isolate p-connection layer 122 from n-contact 114 and n-connection layer 124 in the vicinity of capacitor 164.

Figure 9:
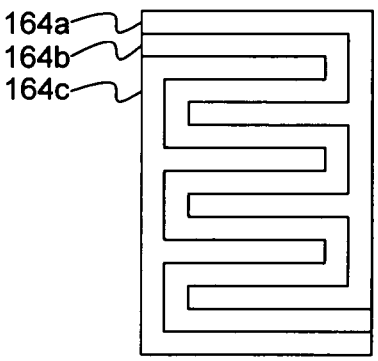
FIG. 9 is a cross sectional view of a capacitor.

A cross sectional view of capacitor 164 is shown in FIG. 9. Stacks of metal layers form two plates of the capacitor, 164*a* and 164*c*. Each of the plates is shaped like a comb and arranged such that portions of plate 164*a* are interdigitated with portions of plate 164*c*. The two metal plates 164*a* and 164*c* are separated by a dielectric 164*b*. The top of plate 164*a* as shown in FIG. 9 is connected to n-contact 114 on the right side of capacitor 164 as shown in FIG. 6, and the bottom of plate 164*c* as shown in FIG. 9 is connected to p-connection layer 122 on the left side of capacitor 164 as shown in FIG. 6. The capacitance of capacitor 164 is controlled by adjusting the overlapping area of and spacing between plates 164*a* and 164*c*.

Figure 11:
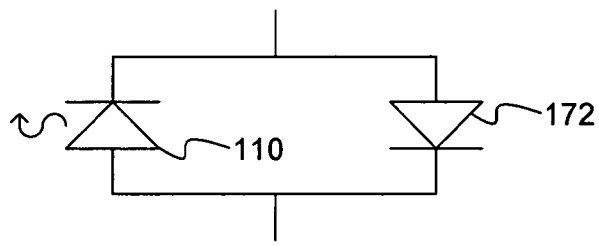
FIG. 11 is a circuit diagram of the device illustrated in FIG. 10.

FIG. 11 is a circuit diagram of another example of a device including an integrated circuit element, according to embodiments of the invention. An electrostatic discharge (ESD) protection diode 172 is formed between the semiconductor layers that form light emitting diode 110 and between the connection layers used to connect the device to an external structure. Diode 172 is connected in anti-parallel configuration with light emitting diode 110. Diode 172 clamps reverse breakdown in light emitting diode 110.

Figure 10:
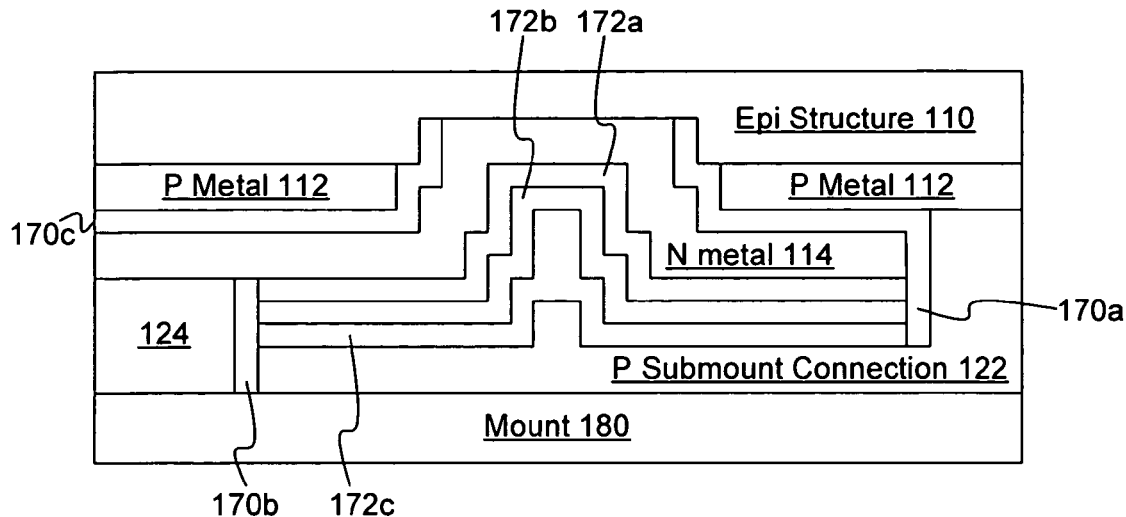
FIG. 10 is a cross sectional view of a part of a device including a semiconductor diode disposed between the light emitting semiconductor layers and the connection layers used to connect the device to an external structure, according to embodiments of the invention.

FIG. 10 is a cross sectional view of a portion of a device according to the circuit diagram shown in FIG. 11. As in FIG. 6, an n-contact 114 is connected to an n-type region in a mesa formed in epitaxial structure 110. P-contacts 112 are formed on the remaining surface of epitaxial structure 110. ESD protection diode 172 is disposed between p-connection layer 122 and n-contact 114. A p-type silicon layer 172*a* contacts n-contact 114, an n-type silicon layer 172*c* contacts p-connection layer 122, and an i-type silicon layer 172*b* is disposed between p-type layer 172*a* and n-type layer 172*c*. Alternatively, ESD protection diode 172 may be a Schottky diode which includes an n-type or p-type silicon layer sandwiched between metal layers. The silicon layers of ESD protection diode 172 may be, for example, amorphous layers formed by plasma enhanced chemical vapor deposition (PECVD), or polycrystalline layers formed by laser pulsing or annealing after PECVD of amorphous layers. Silicon layers formed by PECVD may be deposited at temperatures low enough to avoid damage to other parts of the device such as epitaxial structure 110 and p- and n-contacts 112 and 114. For example, silicon layers 172*a*, 172*b*, and 172*c* of ESD protection diode 172 may be formed at temperatures less than 250° C. For clarity in FIG. 10, silicon layers 172*a* is shown in direct contact with n-metal 114 and silicon layer 172*c* is shown in direct contact with connection 122. In some embodiment, one or more additional metal layers may be disposed between silicon layers 172*a* and 172*c* and the metal layers to which they connect in FIG. 10. These additional metal layers may be, for example, ohmic contacts to one or both of silicon layers 172*a* and 172*c* or guard metal layers.

Figure 1:
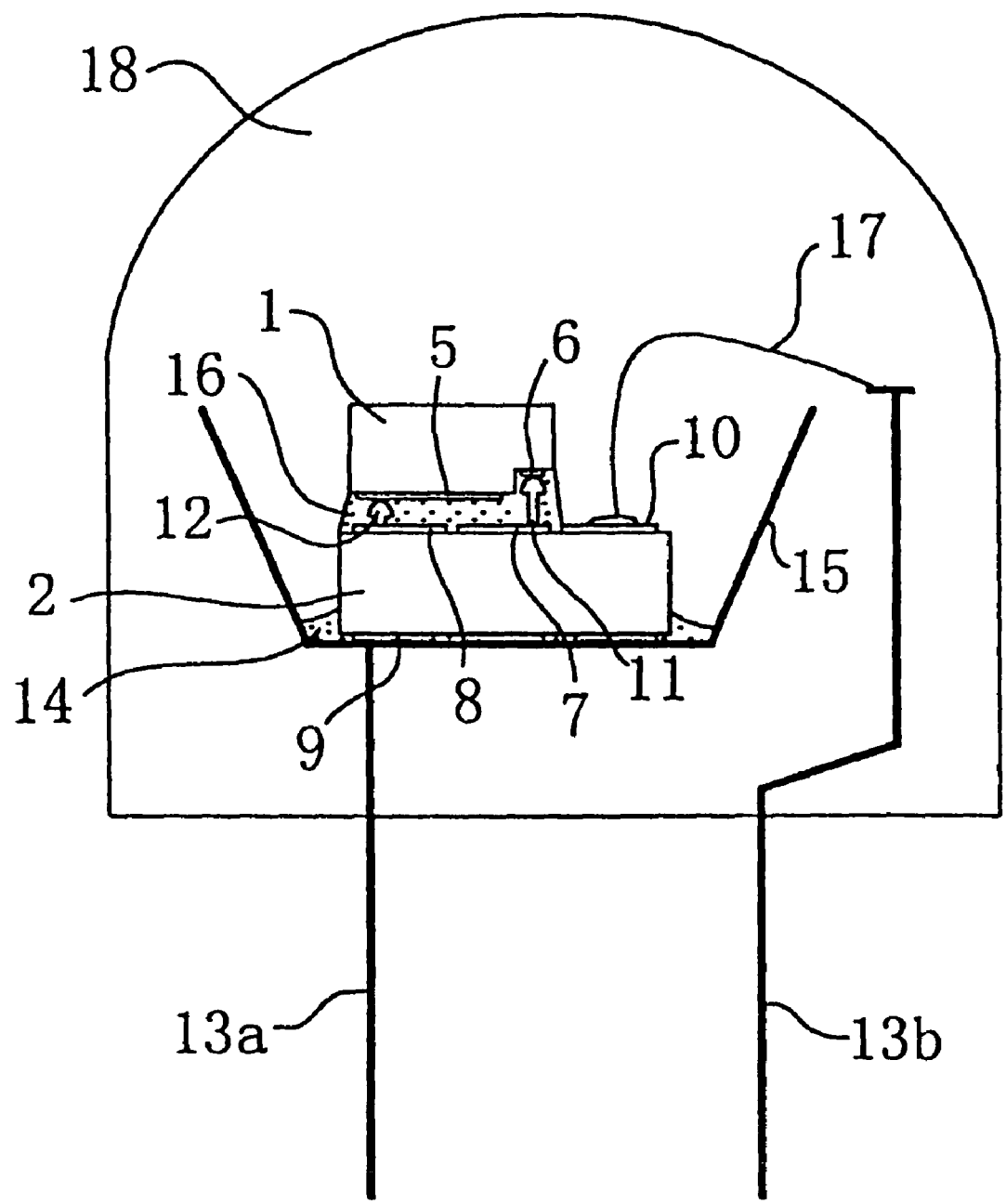
FIG. 1 illustrates a prior art LED element mounted on a silicon diode.
Figure 2:
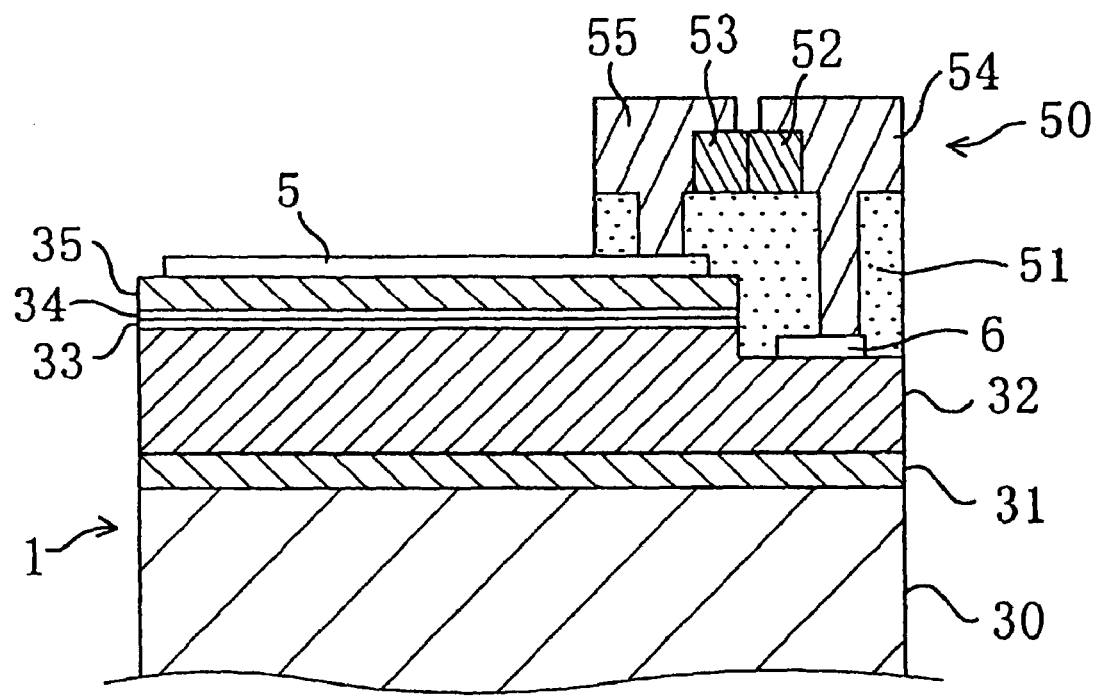
FIG. 2 illustrates a prior art LED element including an integrated silicon diode.

Unlike the diode element 50 shown in FIG. 2, the p-n junction of ESD protection diode 172 shown in FIG. 10 is generally parallel to the p-n junction of light emitting diode 110. The perpendicular orientation of the p-n junction of diode element 50 in FIG. 2 relative to active region 33 limits the ability of diode element 50 to shunt current away from active region 33. In contrast, the junction area of ESD protection diode 172 can be made much larger than that of diode element 50, which improves the ESD protection provided by diode 172. In addition, unlike diode element 50 of FIG. 2, ESD protection diode 172 of FIG. 10 can be formed without removing part of the light emitting region to accommodate the ESD protection element. For a device of the same area, the light emitting region of FIG. 10 may be larger than active region 33 of FIG. 2, potentially resulting in more light emission from the device of FIG. 10. Also, since a transparent path to diode element 50 through growth substrate 30 exists in the space between electrodes 5 and 6, the device of FIG. 2 is likely not compatible with some growth substrate removal techniques such as laser melting, where the interface between the growth substrate and the epitaxial structure is exposed to laser light through the growth substrate, in order to melt the epitaxial material to remove the growth substrate. Exposure to the laser light required for growth substrate removal may damage the diode element. In contrast, in the device of FIG. 10, the growth substrate (not shown) would be located on the top of epitaxial structure 110. ESD protection diode 172 is not "visible" through the growth substrate, since n-contact 114, which is typically opaque, is disposed between the growth substrate and ESD protection diode 172. Accordingly, ESD protection diode 172 is protected from the laser light required for laser melting by n-contact 114. Further, unlike diode element 50 which may reduce light extraction from the device by absorbing some light which otherwise might escape the semiconductor layers, ESD protection diode 172 does not block the path of light escaping from the semiconductor layers in the device.

Though in each of FIGS. 6 and 10 only one via is shown in which n-contact 114 is formed, it is to be understood that the devices of FIGS. 6 and 10 may include multiple vias, as shown in FIGS. 3-5; additional circuit elements may be formed near the via shown in FIGS. 6 and 10 or near other vias that are not shown; and the circuit elements shown in FIGS. 6 and 10 may extend across multiple vias. In addition, the circuit elements shown in the devices of FIGS. 6 and 10 are merely examples of particular circuit elements and configurations, and are not meant to be limiting. For example, the ESD protection diode shown in FIG. 10 may be combined with the metal and dielectric circuit elements shown in FIG. 6. Embodiments of the invention include any circuit element that may be included in a device between the epitaxial layers and connection layers 122 and 124. The devices in FIGS. 6 and 10 are shown in a flipped orientation, as when the device is mounted on a mount as a flip chip with the growth substrate (not shown) still attached or as a thin film device from which the growth substrate has been removed for example by laser melting, etching, or any other appropriate technique. In the orientation shown in FIGS. 6 and 10, p-contacts 112 and/or n-contacts 114 may be reflective, in order to direct light out the top of epitaxial structure 110.

FIG. 10 shows a portion of mount 180, which may be any structure such as a reflector cup, printed circuit board, or package element such as a ceramic, semiconductor, or metal substrate. The epitaxial structure 110 is connected to mount 180 through connection layers 122 and 124. In embodiments where the growth substrate is removed from epitaxial structure 110, the device may be bonded to mount 180 on a wafer scale, such that an entire wafer of devices are bonded to a wafer of mounts, then the individual devices are diced after bonding. Alternatively, a wafer of devices may be diced into individual devices, then each device bonded to mount 180 on a die scale, as described in more detail in U.S. application Ser. No. 10/977,294, "Package-Integrated Thin-Film LED," filed Oct. 28, 2004, and incorporated herein by reference.

Figure 12:
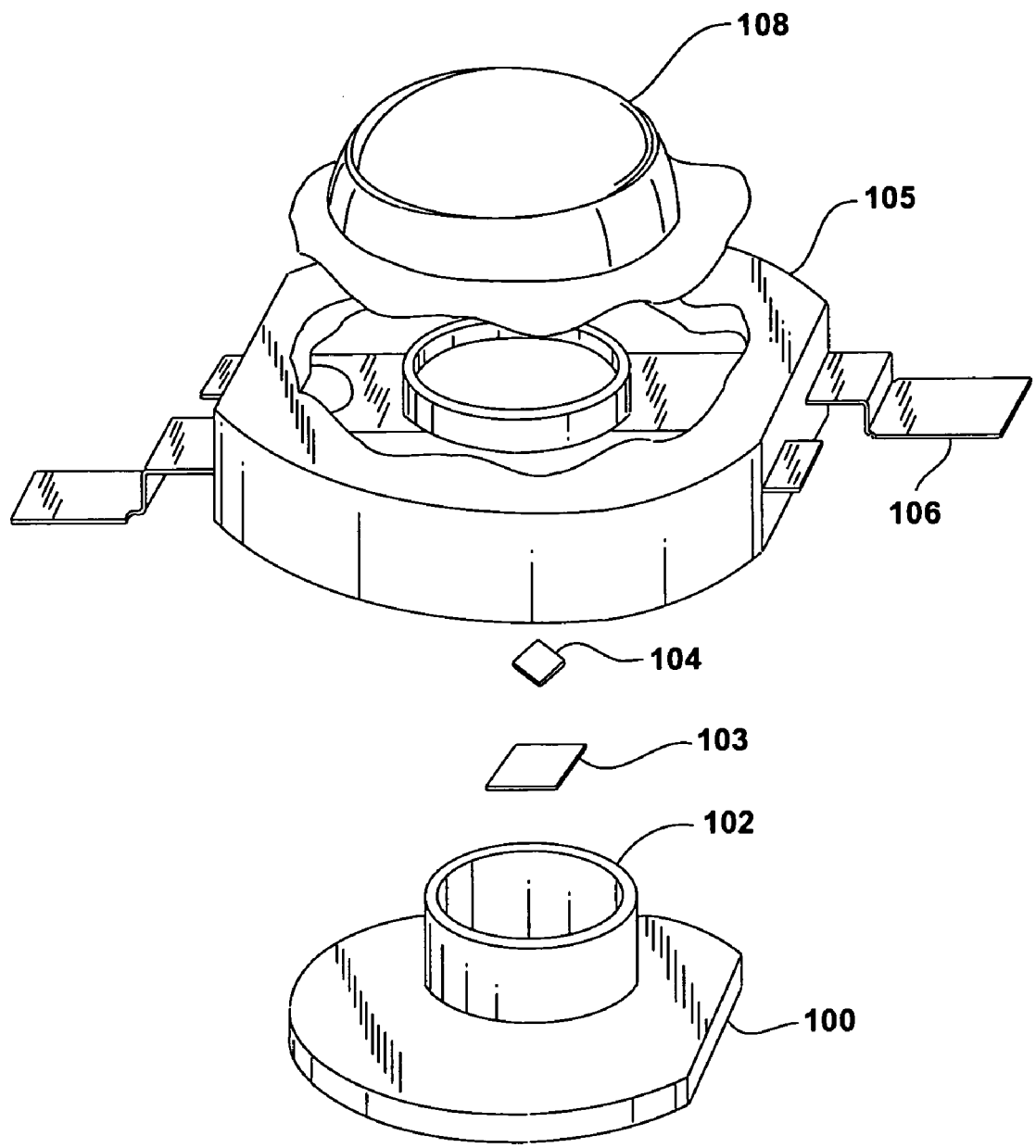
FIG. 12 is an exploded view of a package for a semiconductor light emitting device.

FIG. 12 is an exploded view of a packaged light emitting device, as described in more detail in U.S. Pat. No. 6,274,924. A heat-sinking slug 100 is placed into an insert-molded leadframe. The insert-molded leadframe is, for example, a filled plastic material 105 molded around a metal frame 106 that provides an electrical path. Slug 100 may include an optional reflector cup 102. The light emitting device die 104, which may be any of the devices described in the embodiments above, is mounted directly or indirectly via a thermally conducting submount 103 to slug 100. A cover 108, which may be an optical lens, may be added.

Figure 13:
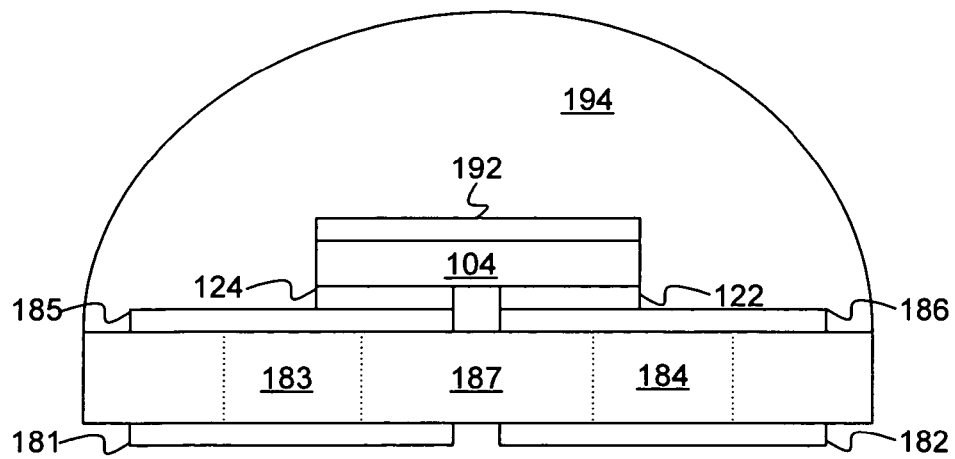
FIG. 13 is a cross sectional view of an alternative package for a semiconductor light emitting device.

FIG. 13 is a cross sectional view of an alternative packaged light emitting device. The light emitting device die 104, which may be any of the devices described in the embodiments above, is mounted on a mount 187, which may be, for example, ceramic. Connection layers 122 and 124 connect die 104 to metal layers 185 and 186 on mount 187. Conductive vias 183 and 184 through the mount connect conductive mounting pads 181 and 182 to metal layers 185 and 186. One or more elements 192 such as, for example, a wavelength converting layer or layers, a mirror stack such as a Bragg reflector, an antireflective coating, and/or a dichroic filter may be disposed over die 104. A transparent material 194, which is shaped as a lens in FIG. 13, may cover the die. The structure shown in FIG. 13 may be connected to another structure, such as, for example, a PC board, metal core PC board, ceramic substrate, or direct bond copper substrate, by mounting pads 181 and 182.

Having described the invention in detail, those skilled in the art will appreciate that, given the present disclosure, modifications may be made to the invention without departing from the spirit of the inventive concept described herein. For example, though the above examples describe III-nitride devices, in other embodiments the devices may be formed form other materials systems, such as III-V devices including phosphorus or arsenic or II-VI devices. Therefore, it is not intended that the scope of the invention be limited to the specific embodiments illustrated and described.

What is being claimed is:

1. A device comprising:
    a semiconductor structure comprising a light emitting region disposed between an n-type region and a p-type region;
    a first metal contact in direct contact with the n-type region and a second metal contact in direct contact with the p-type region;
    a first connection layer electrically connected to the n-type region and a second connection layer electrically connected to the p-type region, wherein the first and second connections layers are formed on the same side of the semiconductor structure; and
    a circuit element disposed between one of the first and second contacts on the one hand and the second connection layer on the other hand, wherein the circuit element comprises at least one metal layer and a dielectric layer, the dielectric layer isolating the metal layer from one of the first and second contacts or one of the first and second connection layers, wherein the first and second contacts are formed between the semiconductor structure on the one hand and the first and the second connection layers on the other hand.

2. The device of claim 1 wherein the circuit element comprises a resistor.

3. The device of claim 1 wherein the circuit element comprises a capacitor.

4. The device of claim 1 wherein the circuit element comprises an inductor.

5. The device of claim 1 wherein the circuit element is electrically connected between one of the first and second contacts and one of the first and second connection layers.

6. The device of claim 5 wherein:
    a portion of the first contact overlies a portion of the second connection layer, and
    the circuit element is disposed between the first contact and the second connection layer.

7. The device of claim 1 further comprising a cover disposed over the light emitting region.

8. The device of claim 1 wherein the circuit element is a resistor disposed between the second metal contact and the second connection layer.

9. The device of claim 8 further comprising a capacitor disposed between the first metal contact and the second connection layer.

10. The device of claim 1 wherein the circuit element is a capacitor disposed between the first metal contact and the second connection layer.

* * * * *